(12) United States Patent
Eldridge

(10) Patent No.: US 7,956,633 B2
(45) Date of Patent: Jun. 7, 2011

(54) STACKED GUARD STRUCTURES

(75) Inventor: Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/308,094

(22) Filed: Mar. 6, 2006

(65) Prior Publication Data
US 2007/0205780 A1    Sep. 6, 2007

(51) Int. Cl.
*G01R 31/00* (2006.01)
(52) U.S. Cl. ............................. 324/756.03; 324/754.07
(58) Field of Classification Search .......... 324/754–765, 324/158.1
See application file for complete search history.

(56) References Cited

U.S. PATENT DOCUMENTS

| | | | |
|---|---|---|---|
| 4,189,825 A * | 2/1980 | Robillard et al. .................. 438/4 |
| 5,103,557 A * | 4/1992 | Leedy ................................ 438/6 |
| 5,416,429 A * | 5/1995 | McQuade et al. ............. 324/762 |
| 5,576,630 A * | 11/1996 | Fujita ............................. 324/760 |
| 5,621,333 A * | 4/1997 | Long et al. ..................... 324/762 |
| 6,215,320 B1 * | 4/2001 | Parrish .......................... 324/754 |
| 6,292,003 B1 * | 9/2001 | Fredrickson et al. .......... 324/754 |
| 6,351,133 B1 * | 2/2002 | Jones et al. .................... 324/754 |
| 6,616,966 B2 * | 9/2003 | Mathieu et al. .................. 29/842 |
| 6,657,130 B2 * | 12/2003 | Van Dyke et al. ............. 174/255 |
| 6,861,858 B2 * | 3/2005 | Chen et al. .................... 324/755 |
| 7,068,057 B2 | 6/2006 | Tervo et al. |
| 2005/0068054 A1 * | 3/2005 | Mok et al. ...................... 324/754 |
| 2007/0139061 A1 | 6/2007 | Eldridge et al. |
| 2008/0143358 A1 | 6/2008 | Breinlinger |

* cited by examiner

*Primary Examiner* — Ha Tran T Nguyen
*Assistant Examiner* — Richard Isla Rodas
(74) *Attorney, Agent, or Firm* — Kirton & McConkie

(57) ABSTRACT

Systems and methods for providing a stack with a guard plane embedded in the stack are disclosed. An electrical apparatus can be made by forming a stack comprising an electrically conductive signal structure, an electrical guard structure, and an electrically insulating structure disposed between the signal structure and the guard structure. The signal structure, insulating structure, and guard structure can be aligned one with another in the stack.

20 Claims, 14 Drawing Sheets

STACKED GUARD STRUCTURES

BACKGROUND

Using guard structure techniques, signal traces (e.g., electrically conductive traces of material disposed on or embedded within a substrate and configured to carry one or more electrical signals) can be electrically protected from such things as capacitive coupling with a nearby trace, cross-talk from another trace, electrical interference, or electrical leakage. The exemplary embodiments of the invention disclosed herein relate to improved guard structures and methods of making and using such guard structures.

SUMMARY

Some embodiments of the invention relate to providing a stacked guard structure. According to some embodiments of the invention, an electrical apparatus can be made by forming a stack comprising a plurality of layers. The layers can comprise alternating electrically conductive and electrically insulative layers. At least one of the electrically conductive layers can comprise a signal trace, and at least one other of the electrically conductive layers can comprise a guard structure configured to protect the signal trace from capacitive coupling, cross-talk, and/or other electrical interference. The one or more signal traces and the one or more guard structures can be aligned one with another in the stack.

These and other features and advantages of embodiments of the invention will be set forth or will become more fully apparent in the description that follows and in the appended claims. The features and advantages may be realized and obtained by means of the instruments and combinations particularly pointed out in the appended claims. Furthermore, the features and advantages of the invention may be learned by the practice of the invention or will be obvious from the description, as set forth hereinafter.

DESCRIPTION OF THE DRAWINGS

In order that the manner in which the above recited and other features and advantages of embodiments of the present invention are obtained, a more particular description of embodiments of the present invention will be rendered by reference to specific embodiments thereof, which are illustrated in the appended drawings. Understanding that the drawings depict only typical embodiments of the invention and are not, therefore, to be considered as limiting the scope of the invention, embodiments of the present invention will be described and explained with additional specificity and detail through the use of the accompanying drawings in which.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for ease of illustration and clarity. In addition, as the term "on" is used herein, one object or element (e.g., a material, a layer, a substrate, etc.) can be "on" another object or element regardless of whether the one object or element is directly on the other object or element or there are one or more intervening objects elements between the one object or element and the other object or element. Also, directions (e.g., above, below, top, bottom, side, etc.), if provided, are relative and provided solely by way of example and for ease of illustration and discussion and not by way of limitation.

Figure 1:
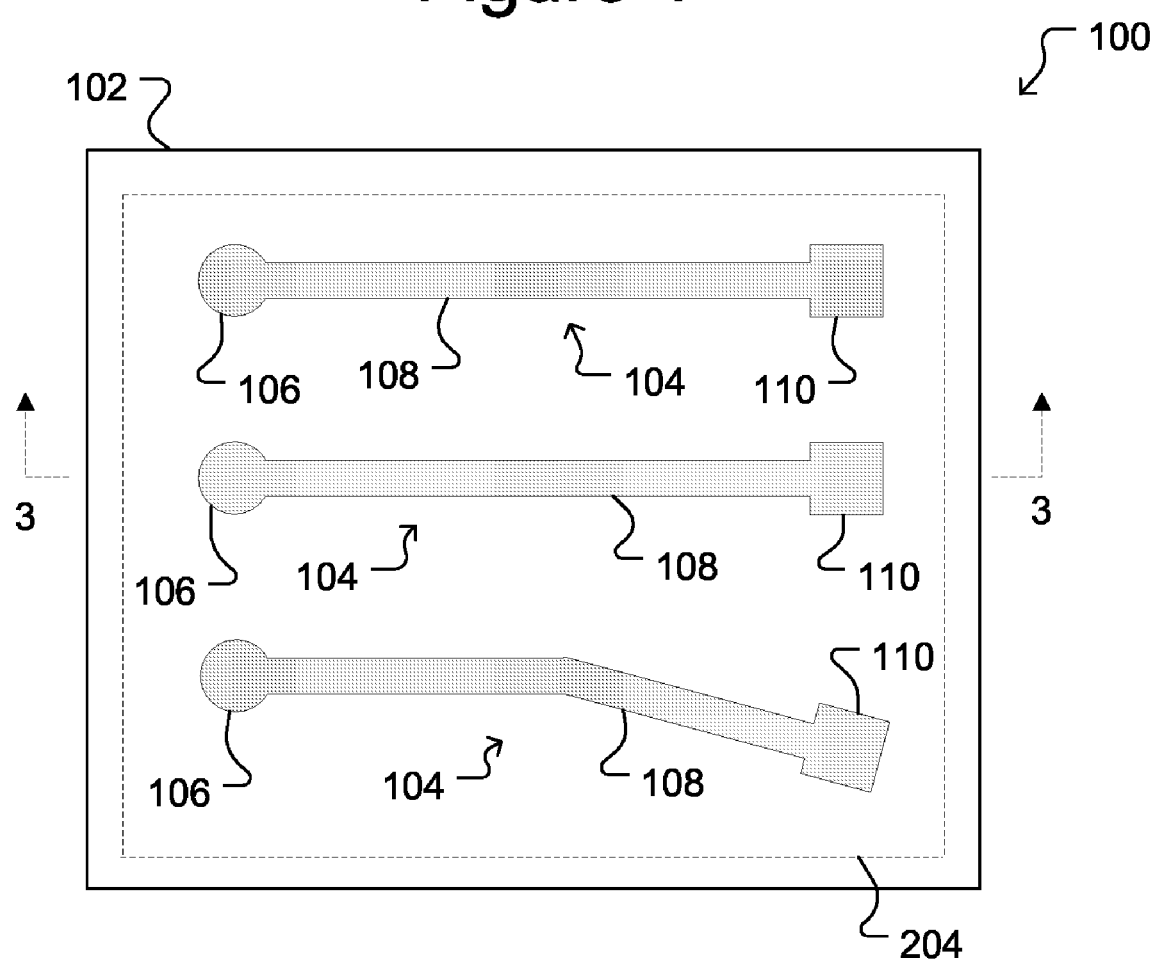
FIG. 1 illustrates a top view of a representative electrical apparatus having a substrate and conductive traces according to some embodiments of the invention.
Figure 2:
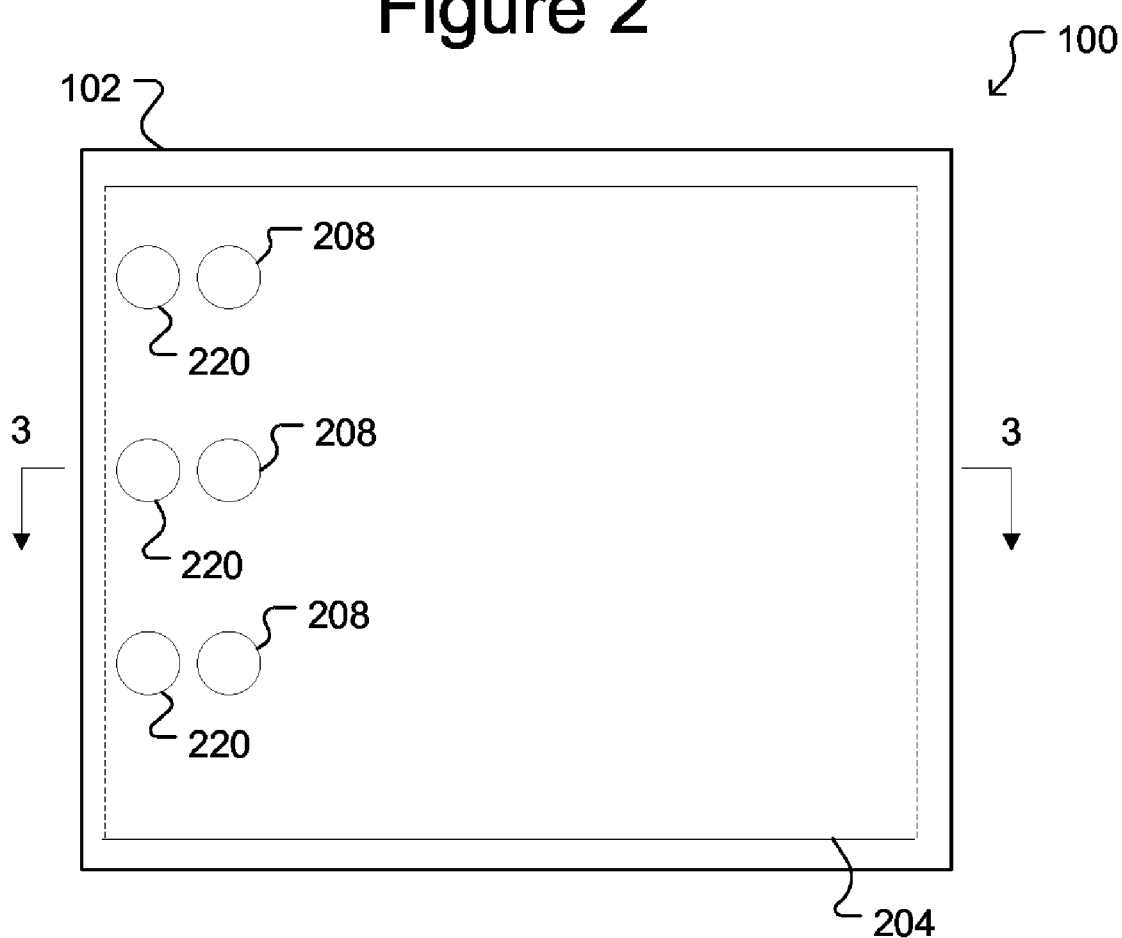
FIG. 2 illustrates a bottom view of the electrical apparatus of FIG. 1.
Figure 3:
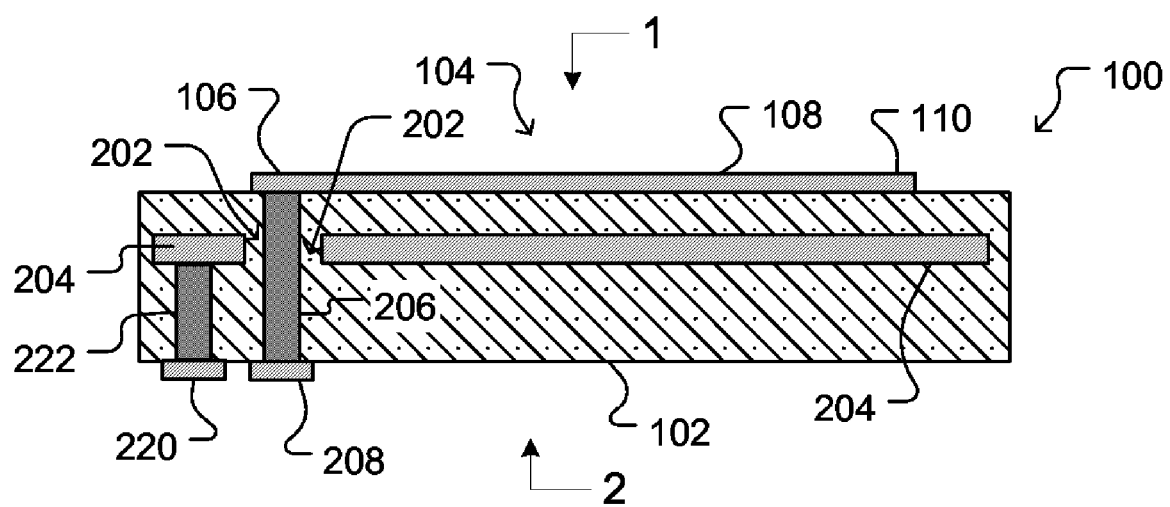
FIG. 3 illustrates a cross-sectional side view of the electrical apparatus of FIG. 1.

FIGS. 1-3 illustrate an exemplary electrical apparatus 100 comprising a substrate 102 with a plurality of signal traces 104 (which for clarity and contrast with other elements are shaded and have a light grey appearance in FIGS. 1, 4, 5, and 8) disposed on one surface of the substrate 102 and a plurality of signal terminals 208 and a plurality of guard terminals 220 disposed on an opposite surface of the substrate 102 according to some embodiments of the invention. (FIG. 1 illustrates a top view, FIG. 2 illustrates a bottom view, and FIG. 3 illustrates a side, cross-sectional view of the electrical apparatus 100.) By way of example, substrate 102 can be a ceramic substrate, a printed circuit board, or other appropriate wiring substrate and can serve as a wiring substrate or some other substrate of electrical apparatus 100. Conductive traces 104 can include conductive lands 106, conductive trace portions 108, and conductive pads 110. Trace portions 108 can electrically connect lands 106 and pads 110. While FIG. 1 illustrates three conductive traces 104, those skilled in the art will appreciate that embodiments of the present invention embrace electrical apparatuses having more than or less than three traces 104. Similarly, more or fewer than three signal terminals 208 and more or fewer than three guard terminals 220 can be provided. Additionally, those skilled in the art will appreciate that embodiments of the present invention embrace a variety of configurations and layouts of traces 104. Moreover, the shapes of lands 106, trace portions 108, and pads 110 shown in the Figures are exemplary only, and lands 106, trace portions 108, and pads 110 can take any shape.

As best seen in FIG. 3, a conductive plane 204 can be embedded within substrate 102. Plane 204 can be generally parallel to traces 104 and, as illustrated in FIGS. 1 and 2 (which show plane 204 in dashed lines), plane 204 can extend across a desired the area of substrate 102 such that a portion of plane 204 is located below traces 104. As will be seen, guard structures for each signal trace 104 can be cut from plane 204.

In the example shown in FIGS. 1-3, signal traces 104 can be configured to carry electrical signals (e.g., data signals, control signals, etc.) between lands 106 and pads 110. Provisions can be made to connect electrically lands 106 and/or pads 110 to other electronic devices (not shown). In the example shown in FIGS. 1-3, electrically conductive signal terminals 208 can be provided on a surface of substrate 102 opposite the surface on which traces 104 are disposed. Electrically conductive vias 206 can electrically connect each signal terminal 208 to one of lands 106, and insulative passages 202 can electrically insulate each via 206 from conductive plane 204. For example, each insulative passage 202 can comprise a hole or gap in the plane 204, which allows a via 206 to pass through the plane 204 without make an electrical connection with the plane 204. As shown in FIG. 3, the hole or gap in the plane 204 that forms the insulative passage 202 can naturally be occupied or filled by material that composes the substrate 102. One signal terminal 208 and one via 206 can be provided for each land 106. Another electronic device (not shown) can thus be electrically connected to lands 106 through signal terminals 208. Alternatively, signal terminals 208 and vias 206 can be dispensed with, and electrical connections from another electronic device (not shown) can be made directly to lands 106.

As shown in FIGS. 2 and 3, guard terminals 220 and corresponding vias 222 can provide electrical connections to plane 204. As mentioned above, and as will be discussed below, guard structures can be cut out of plane 204, and each guard terminal 220 and via 222 can provide a distinct electrical connection to one of the guard structures.

Figure 4:
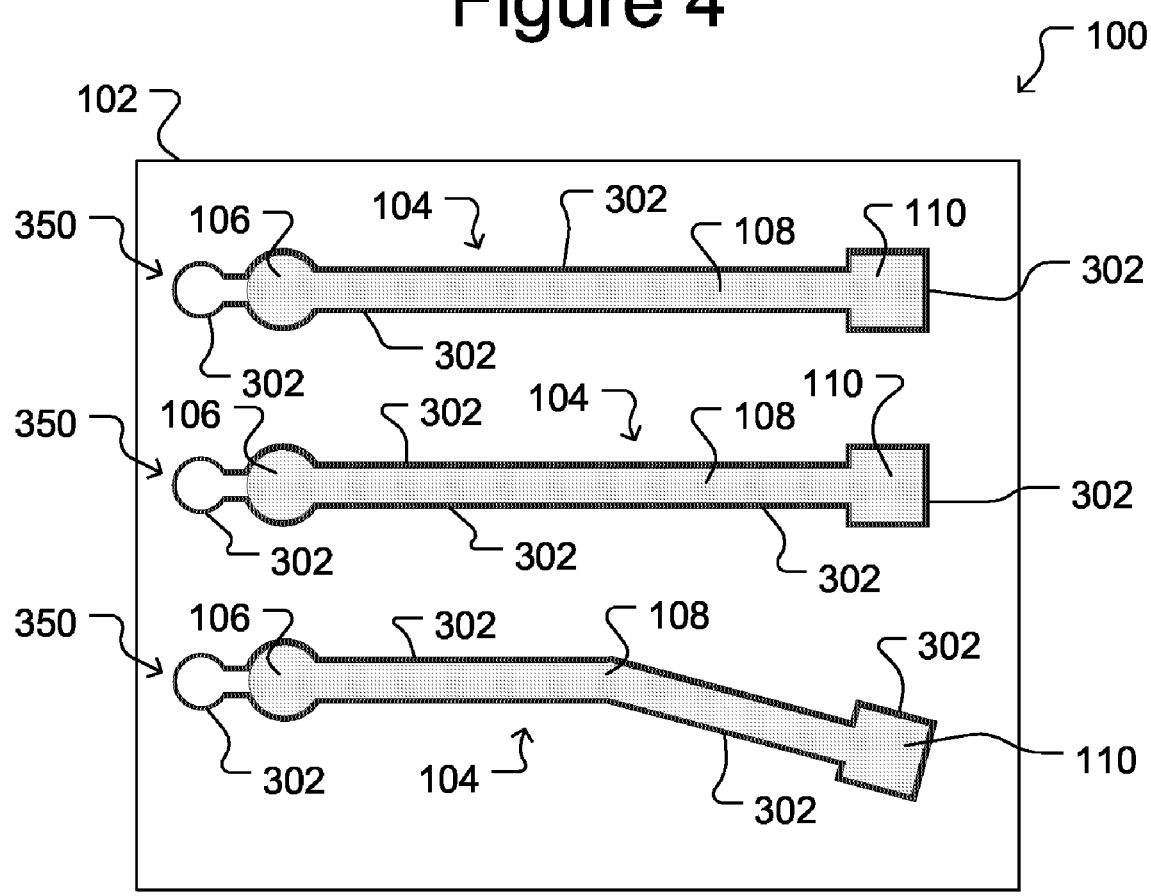
FIG. 4 illustrates a top view of the electrical apparatus of FIG. 1 after trenches are cut to form stacked guard structures for each conductive trace according to some embodiments of the invention.
Figure 5:
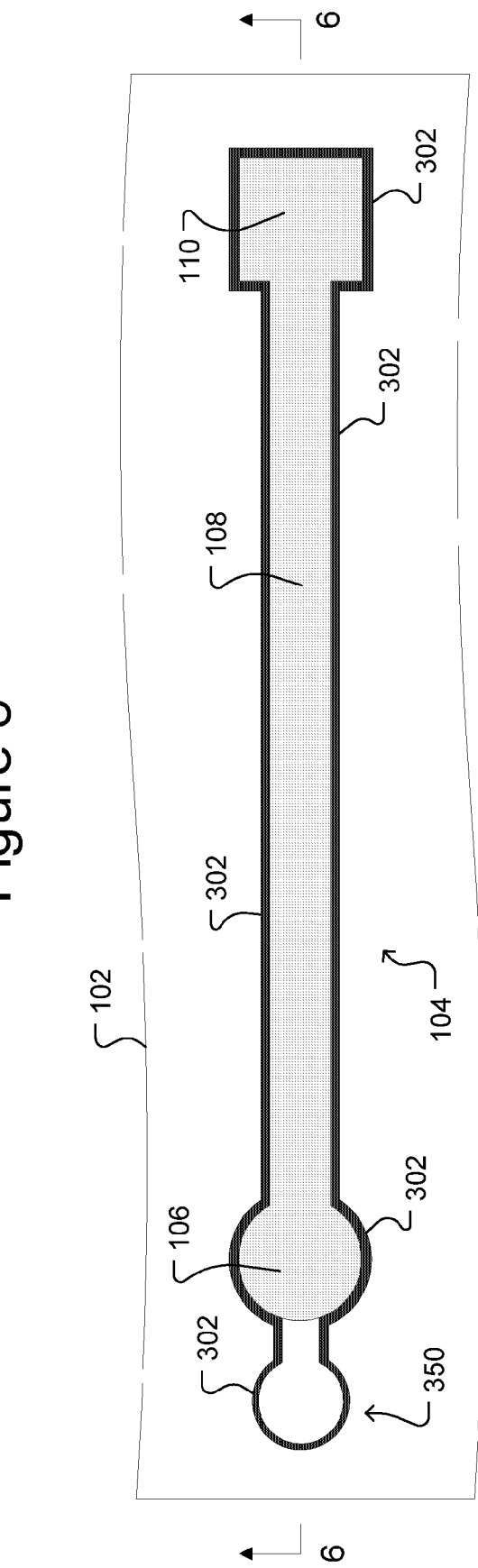
FIG. 5 illustrates a partial view of the illustration of FIG. 4 showing one of the conductive traces.
Figure 6:
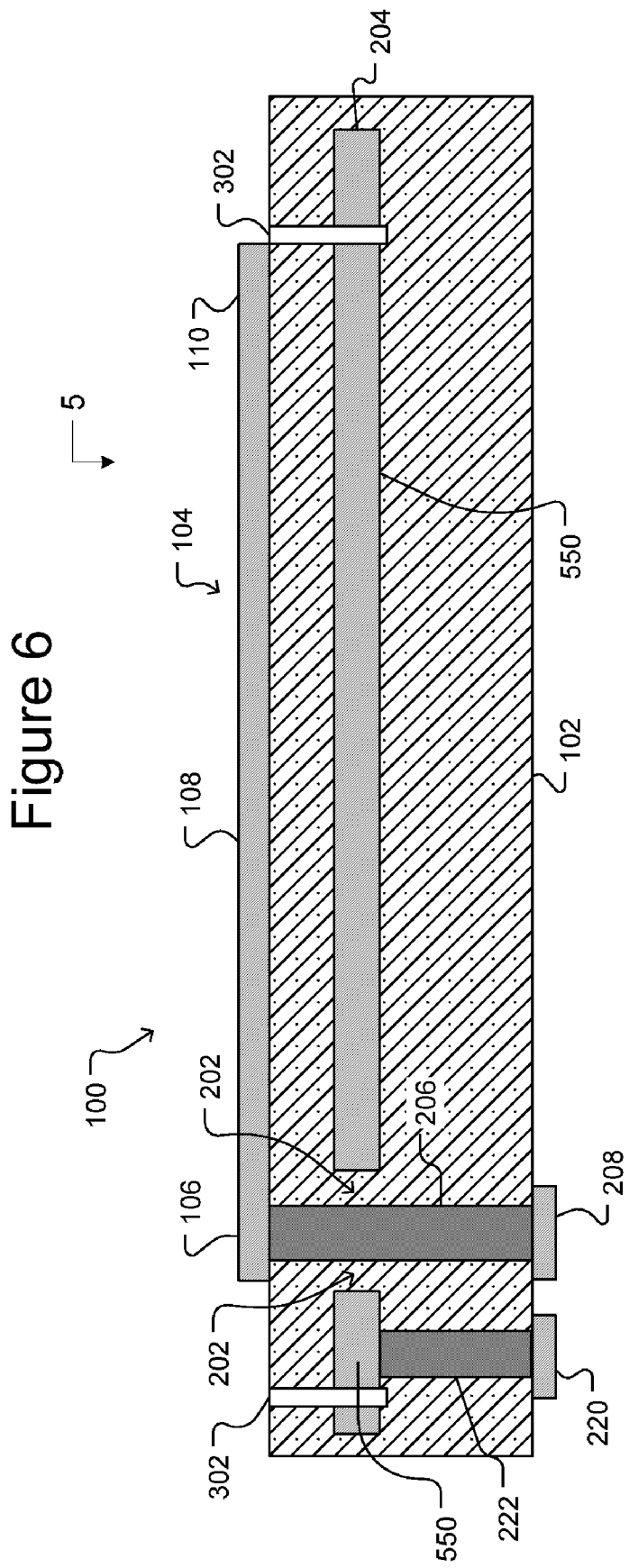
FIG. 6 illustrates a cross-sectional side view taken from FIG. 5.
Figure 7:
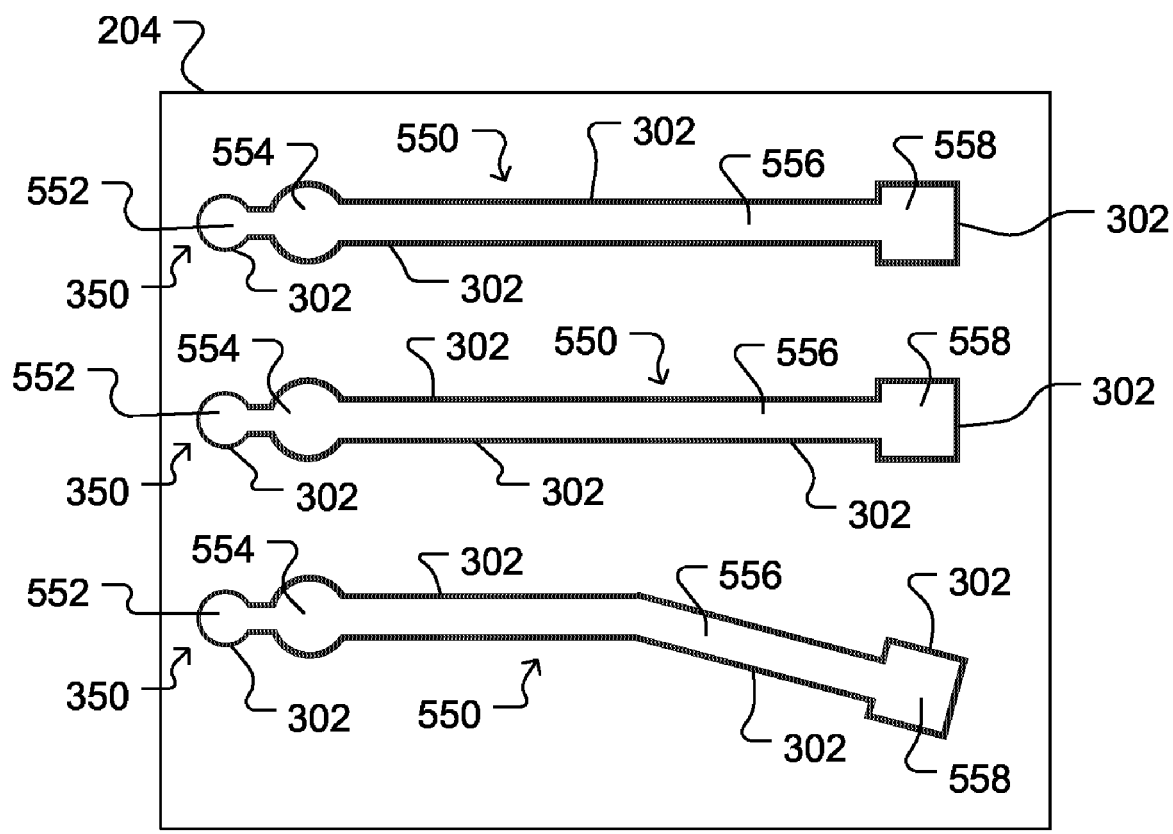
FIG. 7 shows a top view of the conductive plane of the electrical apparatus of FIGS. 4-6, showing the guard structures cut from the plane.

FIGS. 4-7 illustrate exemplary creation of guard structures from plane 204 for each of traces 104 according to some embodiments of the invention. (FIG. 4 illustrates a top view of electrical apparatus 100; FIG. 5 illustrates a partial top view of the electrical apparatus 100 showing one of the signal traces 104; FIG. 6 illustrates a side, cross-sectional view taken from FIG. 5; and FIG. 7 shows the conductive plane 204.) As shown in FIGS. 4-7, a trench 302 can be cut around each trace 104. (For clarity and contrast with surrounding elements, trench 302 is shown shaded dark grey in FIGS. 4, 5, and 7.) Trenches 302 can be cut using any suitable instrument including without limitation a laser or a saw. Alternatively, trenches 302 can be etched or otherwise chemically formed. For example, dry or wet etching processes can be used to form trenches 302.

As best seen in FIG. 6, each trench 302 can extend into substrate 102 such that the trench 302 cuts through conductive plane 204, cutting out of conductive plane a guard structure for each of signal traces 104. As shown in FIGS. 4 and 5, each trench 302 can generally outline one of traces 104. As also shown in FIGS. 4 and 5, each trench 302 can include a portion 350 that does not outline a trace 104. As will be seen, portion 350 can create an area on each guard structure to which via 222 (see FIG. 3) can connect.

FIG. 7 shows a top view of only conductive plane 204 after trenches 302 have been cut into substrate 102. As can be seen, each trench 302 cuts a guard structure 550 out of conductive plane 204. The space created by trench 302 electrically isolates each guard structure 550 from remaining portions of the plane 204 and from other guard structures 550. Electrically insulating material (not shown) can be put into trenches 302 to further insulate electrically each guard structure.

As shown in FIG. 7, each guard structure 550 can be shaped generally like one of signal traces 104. Each guard structure 550 can thus include a portion 554 shaped like a land 106 of a signal trace 104, a portion 556 shaped like a trace portion 108 of a signal trace 104, and a portion 558 shaped like a pad 110 of a signal trace 104. As also shown in FIG. 7, each guard structure 550 can also include an extension portion 552, which as mentioned above, can provide an area where a via, like 222 shown in FIG. 3, can electrically connect to the guard structure 550.

After trench 302 is cut into substrate 102, electrical apparatus 100 comprises signal traces 104 on a surface of substrate 102 and guard structures 550 embedded within substrate 102. Moreover, each guard structure 550 can correspond to one of the signal traces 104, and each guard structure 550 can be generally shaped like and is generally parallel to and aligned with its corresponding signal trace 104. Each guard structure 550 can be wired to protect its corresponding signal trace 104 from electrical interference, such as capacitive coupling with other signal traces 104, cross-talk with other signal traces 104, electromagnetic interference, or leakage current. And because guard structures 550 are in a stacked relationship with signal traces 104, guard structures 550 do not occupy space between adjacent signal traces 104. Consequently, signal traces 104 can be spaced closer to one another than would be possible if guard structures were disposed around traces 104 on the same surface of substrate 102 as signal traces 104.

In some embodiments, for each trace 104, a signal source (not shown) can be connected to one of the pad 110 or the signal terminal 208, and an electrical signal can be driven down the trace 104. A second signal source (not shown) can also be connected to the guard terminal 220 so that the same or substantially the same voltage potential is present on both a signal trace 104 and its corresponding guard structure 550, which can significantly reduce or eliminate capacitive coupling between the signal trace 104 and adjacent signal traces 104. (Guard terminal 220 can alternatively be located anywhere on either surface of the substrate 102, and via 222 can be modified and/or other or additional electrical connections provided to electrically connect the guard terminal 220 to the guard structure 550.) Alternatively, a different voltage potential (e.g., ground or a specific voltage) can be connected to guard terminal 220 so that guard structure 550 is kept at a desired voltage potential. Such a configuration may reduce or eliminate various types of electrical interference that might otherwise affect the corresponding signal trace 104 and can also be used to control the impedance of the corresponding signal trace 104. The applied voltage potentials can be fixed (e.g., direct current (DC) type voltages) or time varying (e.g., alternating current (AC) type voltages).

The configuration of the electrical apparatus 100 shown in FIGS. 1-7 is exemplary only and many variations are possible. For example, traces 108 can be guard structures and signal traces can be cut from conductive plane 204. As another example, terminal 220 can be disposed on the opposite surface of substrate 102. As yet another example, traces 104 can be embedded within substrate 102 rather than being disposed on an outer surface of substrate 102 as shown in FIGS. 1 and 3-6. As still another example, more than two layers of conductive layers can be formed in stacked relationship. For example, more than one conductive plane (e.g., each like plane 204) can be embedded within substrate 102 and multiple conductive structures can thus be cut from substrate 102. As yet another example of a possible variation of the configuration of electrical apparatus 100 shown in FIGS. 1-7 is that guard terminal 220 can be formed as an annular ring around signal terminal 208. In such a case, space or insulating material can be provided between signal terminal 208 and the annular ring implementation of guard terminal 220 to electrically insulate 208 from 220.

Figure 8:
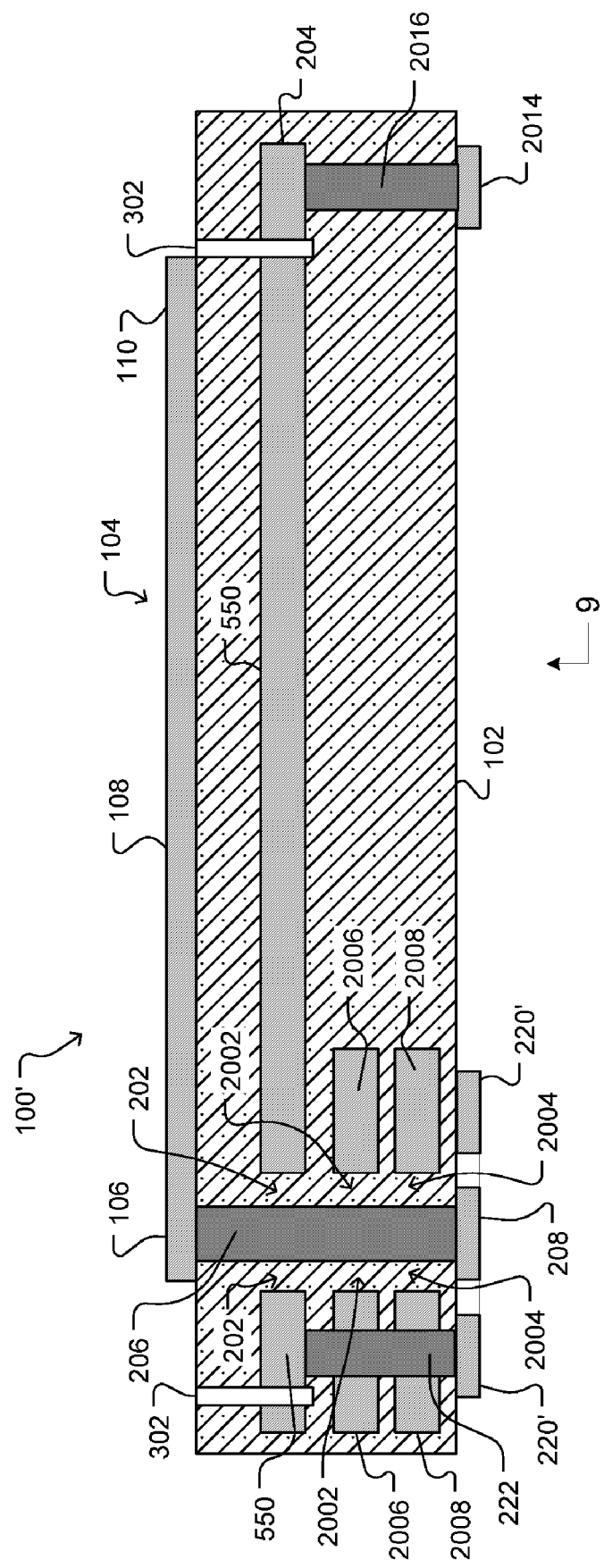
FIG. 8 illustrates in a side, cross-sectional view that generally corresponds to the view shown in FIG. 6, exemplary additions to the electrical apparatus shown in FIGS. 4-6.
Figure 9:
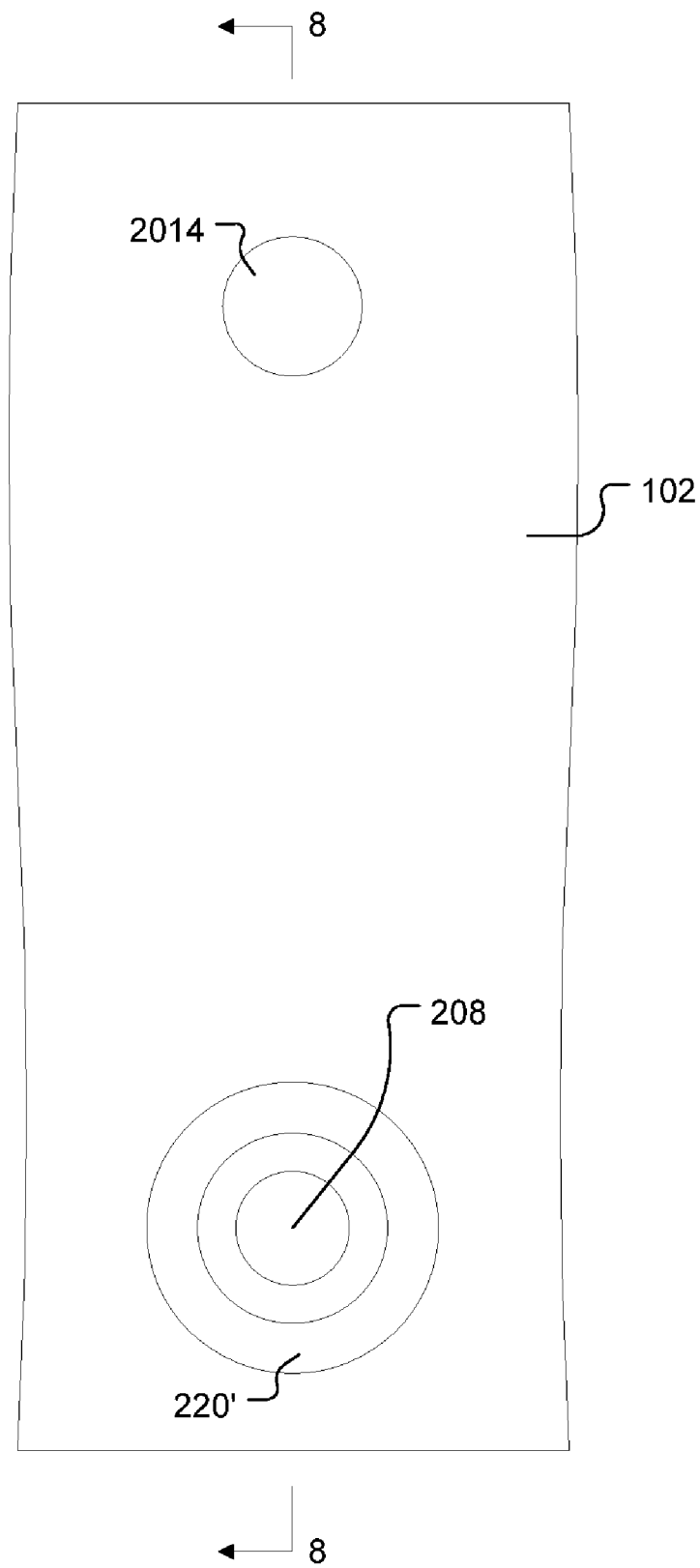
FIG. 9 illustrates a bottom view of the configuration shown in FIG. 8.

FIGS. 8 and 9 illustrate examples of some of the foregoing variations. FIG. 8 shows, in a side cross-sectional view that is similar to the view shown in FIG. 6, a modified electrical component 100', and FIG. 9 shows a partial bottom view of the electrical component 100'. Like numbered elements in FIGS. 6, 8, and 9 can be the same.

As shown in FIG. 8, additional electrically conductive planes 2006, 2008 can be embedded in the substrate 102 and around a signal via 206. (Although two additional planes 2006, 2008 are shown, more or fewer can be used.) As also shown in FIG. 8, insulated passages 2002, 2004 can be provided through planes 2006, 2008 for a via 206. Insulated passages 2002, 2004, can be similar to insulated passage 202. That is, insulated passages 2002, 2004 can comprise holes or gaps in planes 2006, 2008 that allow via 206 to pass through planes 2006, 2008 without making an electrical connection with planes 2006, 2008. Planes 2006, 2008 can thus surround via 206 and act as guard structures to via 206. One set of planes 2006, 2008 can be provided for each via 206, and each such set of planes 2006, 2008 can be electrically insulated one from another. Alternatively, planes 2006, 2008 can be similar in size to plane 204, and like plane 204, can extend across most of a length and a width of the substrate 102. In such a case, guard structures sized and positioned like planes 2006, 2008 are shown in FIG. 8 can be cut from the planes in the same way that guard structure 550 is cut from plane 204.

A guard structure can also be provided for terminal 208. For example, as shown in FIGS. 8 and 9, the guard terminal 220' can be in the form of an annular ring disposed around terminal 208 and can thus act as a guard structure to terminal 208.

Thus, configured as guard structures as shown in FIG. 8, planes 2006, 2008 can protect a via 206 from capacitive coupling with a nearby via, cross-talk from another via, electrical interference, or electrical leakage, and guard terminal 220' can similarly protect terminal 208 from capacitive coupling with a nearby terminal, cross-talk from another terminal, electrical interference, or electrical leakage. Referring to FIG. 8, an electrically conductive terminal 2014 and via 2016 can be provided to make an electrical connection to unused portions of plane 204, that is, the portions of plane 204 separated from guard structure 550 by trench 302.

Figure 10:
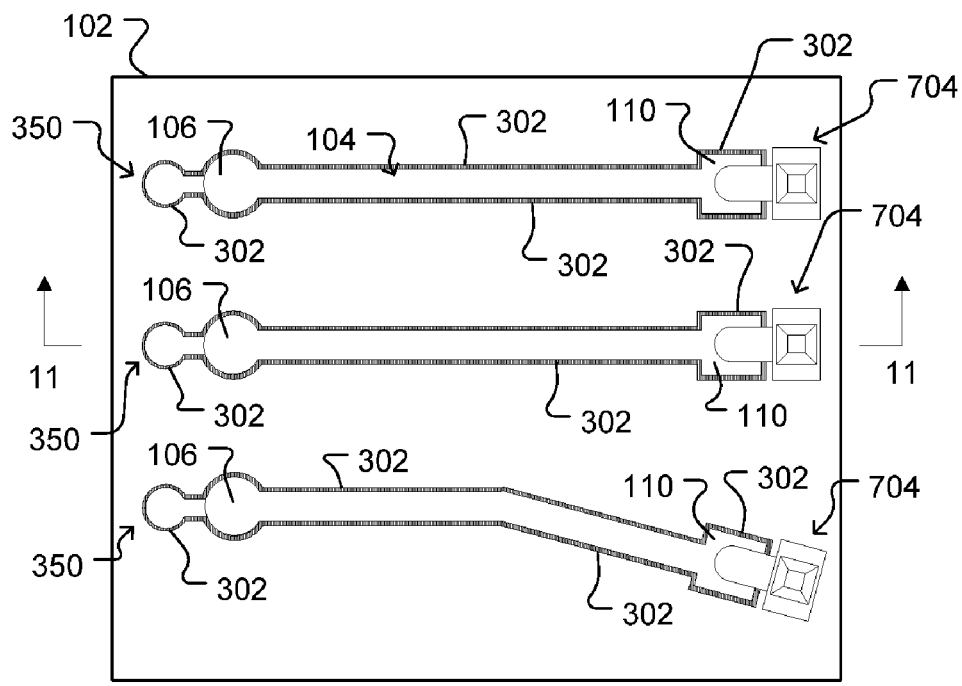
FIG. 10 illustrates a top view of the electrical apparatus of FIGS. 4-6 with probes attached to pads of the conductive traces.
Figure 11:
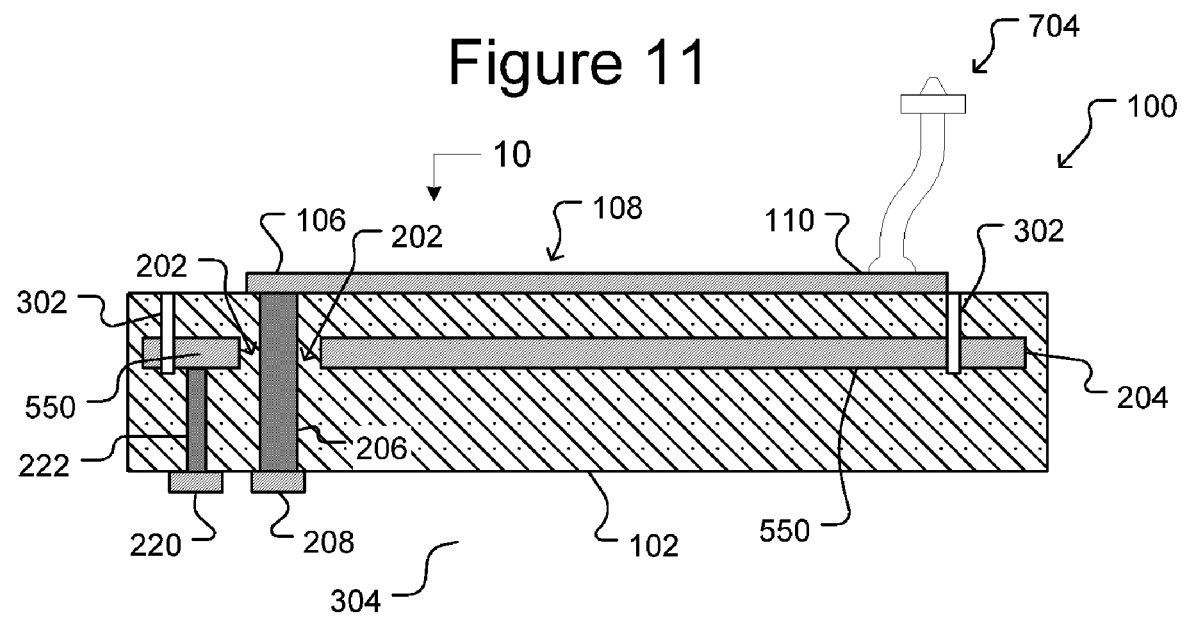
FIG. 11 illustrates a cross-sectional, side view of the electrical apparatus of FIG. 10.

FIGS. 10 and 11 illustrate an exemplary configuration of the electrical component 100 of FIG. 4-7 according to some embodiments of the invention. Although not shown in FIGS. 10 and 11, the electrical component 100' of FIGS. 8 and 9 can also be configured as shown in FIGS. 10 and 11.

As shown in FIG. 10, electrically conductive probes 704 can be coupled to conductive pads 110. Probes 704 can be pressed against and thereby make electrical connections with a first electronic device (not shown). In addition, a second electronic device (not shown) can be electrically connected to signal terminals 208. Electrical signals can then be provided between the first electronic device (not shown) and the second electronic device (not shown) through probes 704, traces 104, vias 206, and signal terminals 208, and traces 104 can be protected, as discussed above, by guard structures 550.

Probes 704 can be resilient, spring-like probes. Non-limiting examples of suitable probes 704 include composite structures formed of a core wire bonded to one of pads 110 and over coated with a resilient material as described in U.S. Pat. No. 5,476,211, U.S. Pat. No. 5,917,707, and U.S. Pat. No. 6,336,269. Probe 704 may alternatively be a lithographically formed structure, such as the spring elements disclosed in U.S. Pat. No. 5,994,152, U.S. Pat. No. 6,033,935, U.S. Pat. No. 6,255,126, U.S. Patent Application Publication No. 2001/0044225, and U.S. Patent Application Publication No. 2001/0012739. Other non limiting examples of probes 704 include conductive pogo pins, bumps, studs, stamped springs, needles, buckling beams, etc.

Figure 12:
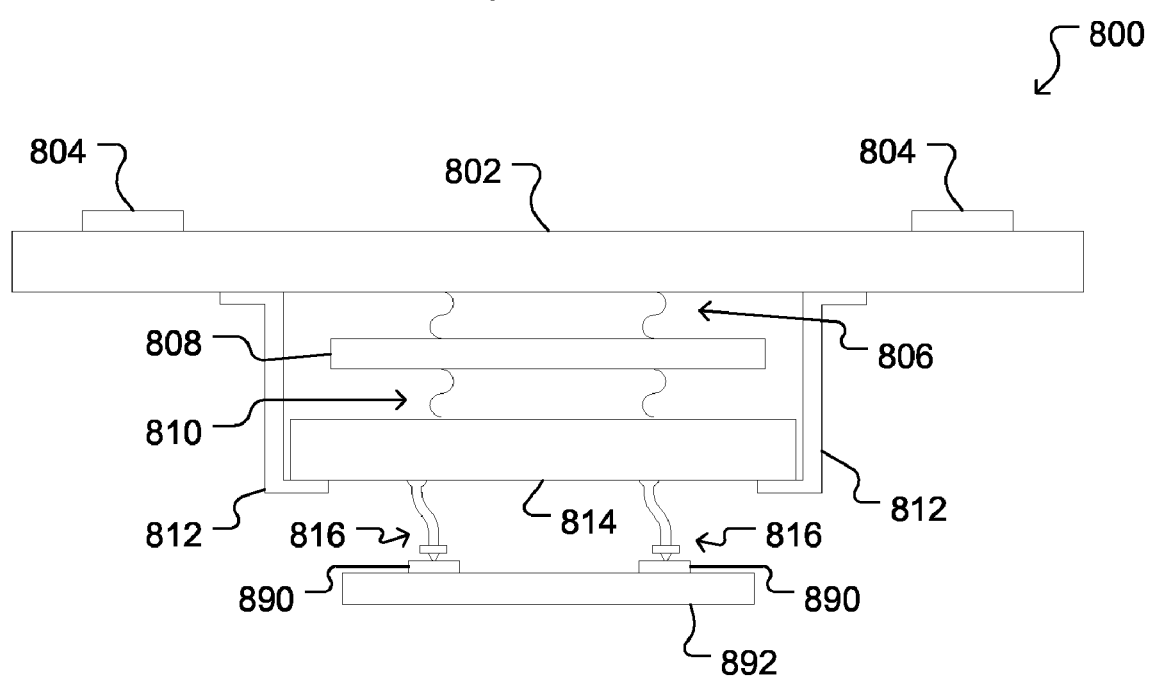
FIG. 12 illustrates a representative probe card assembly according to some embodiments of the invention.

An electrical apparatus 100 or 100' configured as shown in FIGS. 10 and 11 can be used to test electronic devices, such as semiconductor dies. FIG. 12 illustrates an exemplary probe card assembly 800 in which an electrical apparatus 100 configured as shown in FIGS. 10 and 11 can function as a probe substrate 814 in accordance with some embodiments of the invention.

As previously discussed, probes, like probes 704, can be similarly attached to a configuration of electronic component 100 like the configuration 100' shown in FIGS. 8 and 9. In fact, probes, like probes 704, can be attached to any of many possible variations of the electronic component 100 shown in FIGS. 8 and 9.

Turning now to a discussion of an exemplary use of electronic components, like 100, 100', FIG. 12 shows an exemplary probe card assembly 800, which, as shown, can include three substrates: a wiring board 802, an interposer 808 and a probe substrate 814. Terminals 804 can provide electrical connections to and from a tester (not shown), and may be any suitable electrical connection structure including without limitation pads for receiving pogo pins, zero-insertion-force connectors, or any other connection device suitable for making electrical connections with a tester (not shown).

Electrical connections (not shown), such as electrically conductive terminals, vias and/or traces (not shown), can provide electrical connections from terminals 804 through wiring board 802 to electrically conductive spring contacts 806. Additionally, electrical connections (e.g., electrically conductive terminals, vias and/or traces) (not shown) can be provided through interposer 808 to connect spring contacts 806 through interposer 808 to spring contacts 810, which may be like spring contacts 806. Additionally, electrical connections (e.g., electrically conductive terminals, vias and/or traces) (not shown) can electrically connect spring contacts 810 through probe substrate 814 with probes 816, which can be used to contact input and/or output terminals 890 of an electronic device or devices 892 to be tested. Electrical connections (not shown) can thus be provided from terminals 804 through the probe card assembly to probes 816 and from probes 816 to input and/or output terminals 890 of the electronic device or devices 892 to be tested.

Probe substrate 814 and interposer 808 may be secured to wiring board 802 using any suitable means, including, without limitation, bolts, screws, clamps, brackets, etc. In the illustrated embodiment, probe substrate 814 and interposer 808 can be secured to wiring board 802 by way of brackets 812. The probe card assembly 800 illustrated in FIG. 10 is exemplary only and many alternative and different configurations of a probe card assembly may be used. For example, a probe card assembly may include fewer or more substrates than the probe card assembly shown in FIG. 12. U.S. Pat. No.

5,974,622 and U.S. Pat. No. 6,509,751 describe exemplary probe card apparatuses. In addition, U.S. patent application Ser. No. 11/165,833, filed Jun. 24, 2005, and entitled Method And Apparatus For Adjusting A Multi-Substrate Probe Structure, discloses probe card assemblies in which a large array of probes is created from smaller probe arrays disposed on multiple probe heads, and each probe head can be independently adjustable. Various features of the probe card apparatuses described in any of the forgoing patents or patent application can be implemented in the probe card assembly 800.

Probe card assembly 800 can be used as follows. Terminals 804 can be connected to a tester (not shown), and input and/or output terminals 890 of one or more electronic devices 892 can be brought into contact with probes 816. The tester can then generate test data or analog voltage levels or currents (as used herein, the term "test data" includes digital signals and analog signals, including analog voltage levels and currents), which can be provided through the probe card assembly 800 and the ones of the probes 816 in contact with input terminals 890 of the electronic device or devices 892 to the electronic device or devices 892. Response data generated by the electronic device or devices 892 in response to the test data generated by the tester can be sensed by probes 816 in contact with output terminals 890 of the electronic device or devices 892 and provided through the probe card assembly 800 to the tester (not shown). The tester (not shown) can evaluate the response data to determine whether the electronic device or devices 892 pass the testing and/or to rate the electronic device or devices 892. For example, the tester (not shown) can evaluate the response data by comparing the response data generated by the electronic device or devices 892 to expected response data. Probe card assembly 800 can thus function as an electrical interface between a tester (not shown) and one or more electronic devices 892 to be tested. The electronic device or devices to be tested can be dies of an unsingulated semiconductor wafer, dies singulated from a wafer (packaged or unpackaged), dies of an array of singulated semiconductor dies disposed in a carrier or other holding device, one or more multi-die electronics modules, etc.

As mentioned above, probe substrate 814 can be made as shown in any of FIGS. 1-11. For example, electronic component 100 or 100', configured with probes 704 as shown in FIGS. 10 and 11, can be used as the probe substrate 814 in FIG. 12 (in which case probes 704 can be probes 816). In such a case, terminals 208 would be electrically connected to ones of spring contacts 810. Others of spring contacts 810 can be electrically connected to guard terminals 220 to provide a guard voltage to guard structures 550, as discussed above. In this way, test signals can be provided between a tester (not shown) connected to terminals 804 and an electronic device or devices 892 being tested and whose terminals 890 are in contact with probes 816. Moreover, signal traces and or vias on or within wiring board 802 and/or interposer 808 can also be provided with guard structures using any of the methods discussed above.

Figure 13:
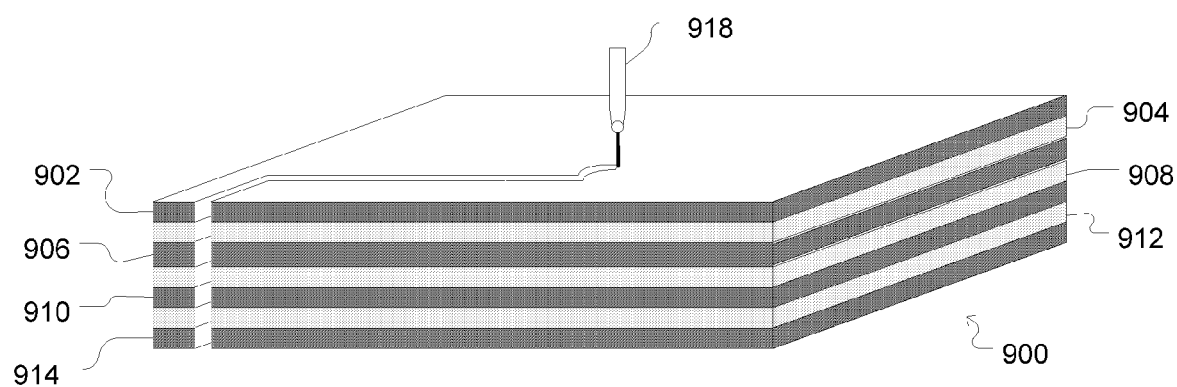
FIG. 13 illustrates cutting of an electronic component from a multi-layer substrate to form an electronic component that includes a stacked guard structure according to some embodiments of the invention.
Figure 14:
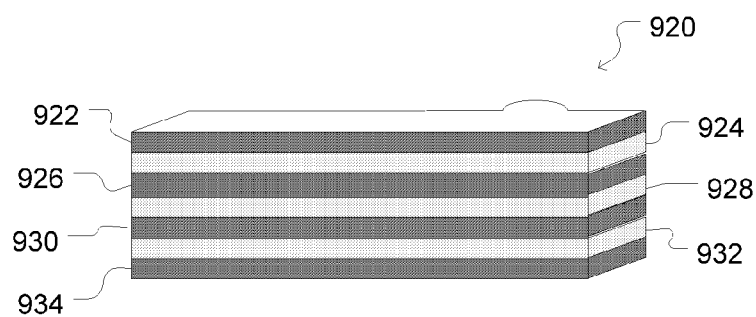
FIG. 14 illustrates the electronic component cut from the substrate of FIG. 13.

FIGS. 13 and 14 illustrate formation of an electronic component 920 in which signal traces and guard structures are simultaneously cut out of a multilayer substrate in accordance with some embodiments of the invention. As shown in FIG. 13, a multi-layered substrate 900 can be provided, and layers 902-914 can be alternating conductive and insulative layers. For example, in FIG. 13, layers 902, 906, 910, and 914 can comprise an electrically insulative material, and layers 904, 908, 912 can comprise an electrically conductive material. As one non-limiting example, substrate 900 can be a multi-layered ceramic substrate in which layers 902, 906, 910, and 914 comprise a ceramic material, and layers 904, 908, 912 comprise a metal, such as copper.

Rather than cutting guard structures from an embedded conductive plane (e.g., 204 in FIGS. 4-6) to match a signal conductor (e.g., one of traces 104 in FIGS. 4-6) previously formed as in FIGS. 4-6, in FIG. 13, a signal conductor and guard planes disposed on either side of the signal conductor can be simultaneously cut from substrate 900.

FIG. 13 illustrates a cutting tool 918 (e.g., a laser, saw, etc.) cutting a structure (920 of FIG. 13) from substrate 900. As shown in FIG. 13, a stacked guard structure 920 cut from substrate 900 can comprise a signal conductor 928 cut from conductive plane 908 and guard conductors 924, 932 cut from conductive planes 904, 912. Insulating layers 922, 926, 930, 934 of structure 920 can be cut from layers 902, 906, 910, 914 of substrate 900. Although a substrate 900 having four insulating layers 902, 906, 910, 914 and three conductive layers 904, 908, 912 is shown in FIG. 13, multilayer substrates with different numbers and patterns of insulating and conductive layers can be used. Moreover, many different types of electronic components can be created by cutting a guard protected stack from the substrate as shown in FIG. 13. Moreover, the initial substrate 900 can comprise materials other than ceramic. For example, substrate 900 can comprise printed circuit board material, organic material, inorganic material, etc.

Figure 15:
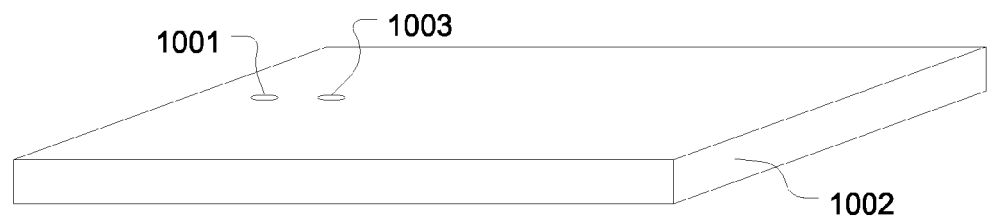
FIGS. 15-22 illustrate another representative process for creating a stacked guard structure according to some embodiments of the invention.

FIGS. 15-22 illustrate another exemplary method for creating a stacked guard structure according to some embodiments of the invention. As shown in FIG. 15, a substrate 1002 can be provided. The substrate 1002 can be any suitable substrate including without limitation a semiconductor substrate (e.g., a silicon wafer), a ceramic substrate, a printed circuit board, a metal substrate, etc. The substrate 1002 can include electrically conductive vias 1001, 1003. As will be seen, via 1001 can extend through substrate 1002 and be electrically connected to a conductive pad 1020 on an opposite surface of the substrate 1002, and via 1003 can extend through substrate 102 and be electrically connected to another conductive terminal 1018 on the opposite surface of the substrate 1002. (See FIG. 22.) As will be seen, terminal 1020 and via 1001 can provide an electrical connection to a guard structure 1008 that is to be made, and terminal 1018 and via 1003 can provide an electrical connection to a signal trace that is to be made. (See FIG. 22.)

Figure 16:
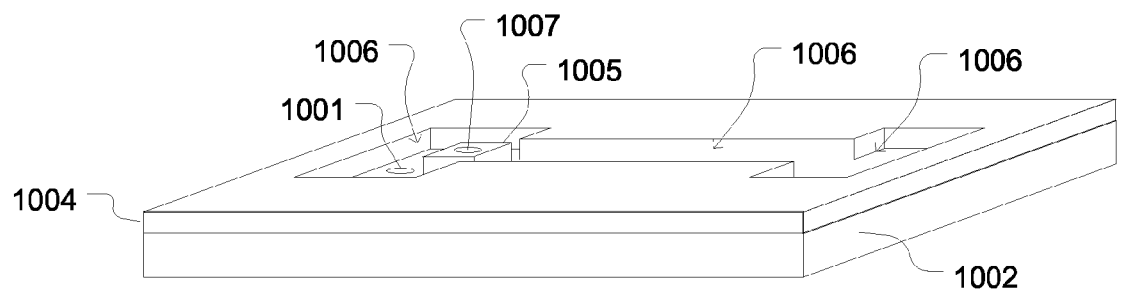

Returning now to a discussion of forming the stacked structure, as shown in FIG. 16, a first layer of masking material 1004 can be deposited on substrate 1002. An example of a suitable masking material 1004 is a photoresist or other type of patternable material. Masking material 1004 can be deposited in a layer and patterned to form opening 1006, an island 1005 of masking material 1004 within opening 1006, and an opening 1007 in the island 1005. As will be seen, the guard structure 1008 (see FIG. 17) can be formed in opening 1006, and opening 1006 can, consequently, be formed with a shape that corresponds to the desired shape of the guard structure 1008. As will also be seen, a conductive via 1009 (see FIG. 17) providing an electrical connection from via 1003 through the guard structure can be formed in opening 1007. Consequently, opening 1007 can be aligned with via 1003.

Figure 17:
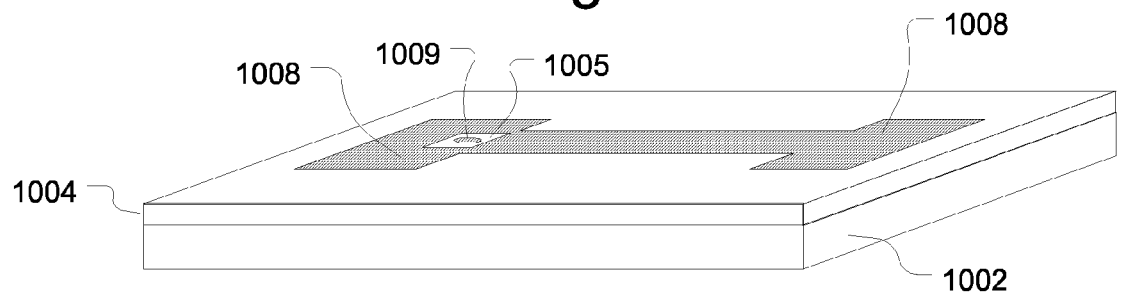

As shown in FIG. 17, openings 1006, 1007 can be filled with a conductive material to form a guard structure 1008 and a via 1009. As previously mentioned, opening 1007 can be aligned with via 1003 so that via 1009 is formed on and electrically connected to via 1003. The island 1005 of masking material 1004 can provide space between the guard structure 1008 and the via 1009 so that the guard structure 1008 and via 1009 are separated and not electrically connected.

The process for filing the openings 1006, 1007 with a conductive material may include use of electroplating, sputtering, or another deposition methods. If the conductive material is electroplated into openings 1006, 1007, the surface of substrate 1002 can be prepared by coating it with a conductive layer (not shown) of material prior to forming masking material 1004. As is known, the conductive layer (not shown) can then be connected to the anode or cathode of plating equipment (not shown), and the substrate 1002 can be placed in a plating bath (not shown) containing plating solution that includes the conductive material electroplated into openings 1006, 1007. The conductive material will then plate onto the portion of the conductive layer (not shown) that is exposed by openings 1006, 1007. Although not shown in the Figures, after the conductive material is deposited into openings 1006, 1007, the island 1005 of masking material can be removed and replaced with an electrically insulating material.

Figure 18:
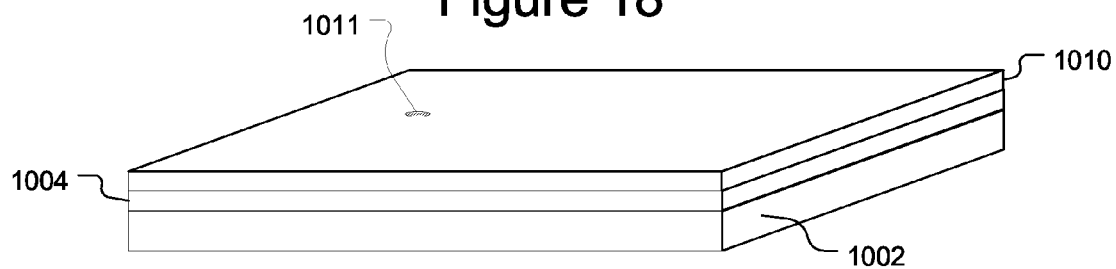

As shown in FIG. 18, a second layer of masking material 1010 can be deposited over the first masking material 1004, guard structure 1008, and via 1009 and patterned to have an opening (not shown) that is then filled with a conductive material to form via 1011. The opening (not shown) in which via 1011 is formed can be aligned with via 1009 so that via 1011 is formed on and electrically connected to via 1009. The second masking layer 1010 can then be removed, leaving via 1011.

Figure 19:
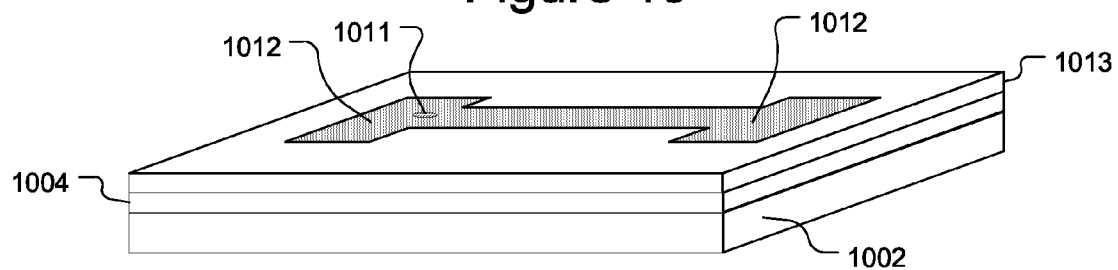
Figure 20:
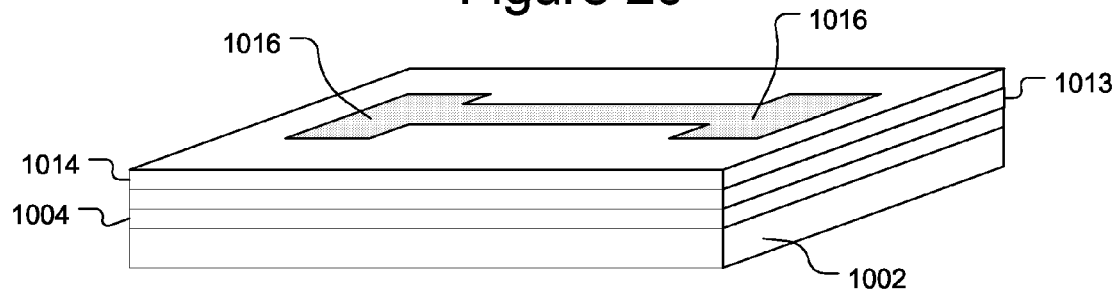

As shown in FIG. 19, a third layer of masking material 1013 can be deposited over the first masking material 1004 and the guard structure 1008 and around via 1011. The third layer of masking material 1013 can then be patterned to have an opening (not shown) that is filled with an insulating material to form an insulating layer 1012 on guard structure 1008 with conductive via 1011 passing through the insulating layer 1012. The insulating material that forms insulating layer 1012 can be depositing using any suitable method, including without limitation chemical vapor deposition, physical vapor deposition, electron beam deposition, thermal evaporation, etc. Other non-limiting exemplary methods include injecting, pouring, or other wise depositing a flowable material into the opening (not shown) in the third layer of masking material 1013 and curing the material. As shown in FIG. 20, a fourth layer of masking material 1014 can be provided and patterned to have an opening that is filled with a conductive material to form a signal trace 1016.

Each of the masking layers 1010, 1013, 1014 can be the same as or similar to masking layer 1004 and can be deposited and patterned like masking layer 1004. The conductive materials that form via 1009, via 1011, and signal trace 1016 can be the same as or different than the conductive material that forms guard trace 1008. The conductive materials that form via 1009, via 1011, and signal trace 1016 can be deposited in the same manner as or in a different manner than the conductive material that forms the guard trace 1008. Moreover, although not shown in the Figures, the materials and elements that form one layer can be planarized before the next layer of masking material is deposited.

Figure 21:
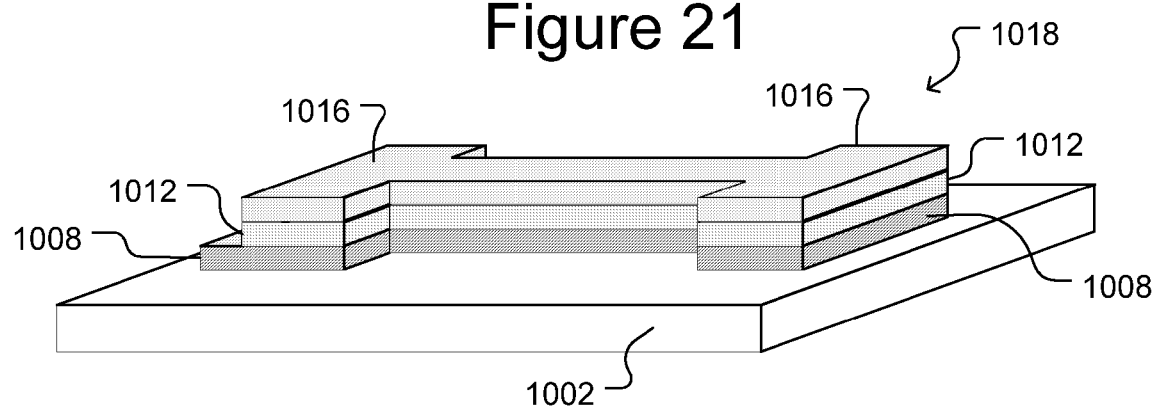

As shown in FIG. 21, the masking material layers 1004, 1013, 1014 can be removed, leaving a layered structure 1018 comprising the guard structure 1008, the insulating layer 1012, and the signal trace 1016. In other embodiments, the guard trace 1008 shown in FIG. 21 can be configured to function as a signal trace, and the signal trace 1016 in FIG. 21 can be configured to function as a guard trace. In addition, multiple stacks comprising a guard structure 1008, insulating layer 1012, and signal trace 1016 can be formed on substrate 1002. The electronic device of FIG. 21 can thus be like the electrical apparatus 100 or 100' shown in FIG. 4-9.

Figure 22:
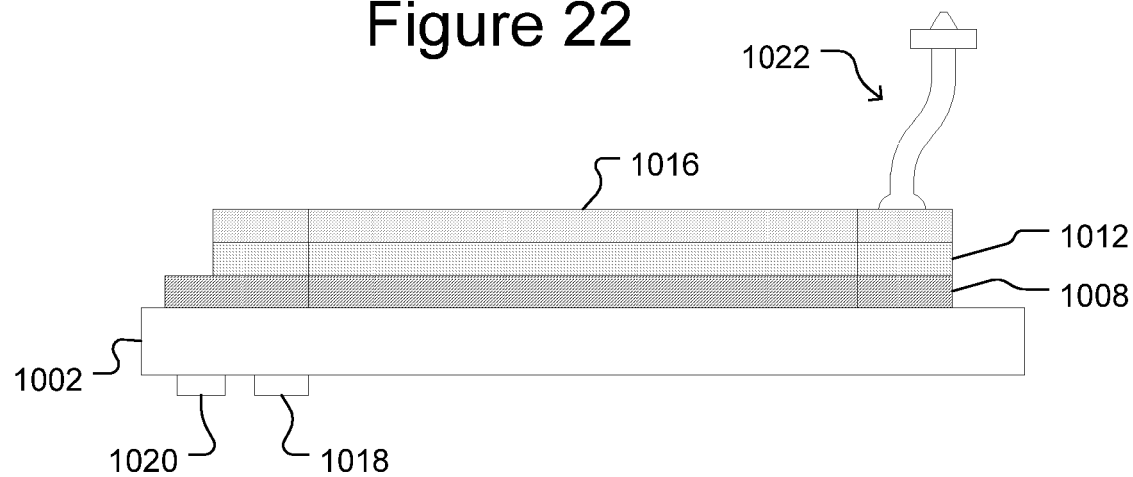

As shown in FIG. 22, a probe 1022 (which can be similar to probe 704 of FIGS. 10 and 11) can be attached to signal trace 1016. As mentioned above, a signal terminal 1018 (which can be similar to signal terminal 208 of FIG. 3) and a guard terminal 1020 (which can be like guard terminal 220 of FIG. 3) can be provided as shown in FIG. 21. Alternatively, guard terminal 220 can be an annular terminal that surrounds signal terminal 1018 like guard terminal 220' of FIGS. 8 and 9. Via 1003 through the substrate 1002, via 1009 through the guard structure 1008, and via 1011 through the insulating layer 1012 can electrically connect the signal terminal 1018 to the guard terminal 1008, and via 1001 through substrate 1002 can electrically connect the guard terminal 1020 to the guard structure. As mentioned, island 1005 creates electrical isolation between the via 1009 and the guard structure 1008 so that the via 1009 and the guard structure 1008 are not electrically connected. In operation, signal terminal 1018 can be connected to the source or destination of a data signal, and guard terminal 1020 can be connected to a source of a guard signal. The signal trace 1016 can thus be protected from capacitive coupling or cross-talk with other signal traces (not shown) and/or other electrical interference.

Although specific embodiments and applications of the invention have been described in this specification, there is no intention that the invention be limited to these exemplary embodiments and applications or to the manner in which the exemplary embodiments and applications operate or are described herein.

What is claimed is:

1. An electrical apparatus comprising:
   an electrically conductive signal structure, an entire outer contour of the signal structure consisting solely of edges having a thickness in a substantially vertical direction, the entire outer contour of the signal structure being electrically insulated from any conductive elements in a same horizontal plane as the signal structure;
   an electrically conductive guard structure, an entire outer contour of the guard structure consisting solely of edges having a thickness in a substantially vertical direction, the entire outer contour of the guard structure being electrically insulated from any conductive elements in a same horizontal plane as the guard structure; and
   an electrically insulating structure disposed between the signal structure and the guard structure, wherein the signal structure is electrically insulated from the guard structure,
   wherein:
   a first shape in the horizontal plane defined by the entire outer contour of the signal structure comprises a first end and a second end and an elongated portion between the first end and the second end,
   a second shape in the horizontal plane defined by a first portion of the outer contour of the guard structure comprises a first end and a second end and an elongated portion between the first end and the second end,
   the first shape and the second shape are substantially the same size and shape and are substantially aligned one with another vertically in a stack, and
   the entire outer contour of the signal structure and the first portion of the outer contour of the guard structure are substantially aligned one with another vertically in the stack.

2. The apparatus of claim 1, wherein there is not a conductive structure in the stack between the signal structure and the guard structure.

3. The apparatus of claim 1, wherein:
a width of the elongated portion of the first shape is less than a width of the first end of the first shape and a width of the second end of the first shape; and
a width of the elongated portion of the second shape is less than a width of the first end of the second shape and a width of the second end of the second shape.

4. The apparatus of claim 1, wherein the electrically insulating structure has an outer contour consisting solely of edges having a thickness in a substantially vertical direction, the outer contour of the insulating structure defining a shape of the insulating structure in a horizontal plane, and the shape of the outer contour of the insulating structure is substantially the same as the first shape and the second shape.

5. The electrical apparatus of claim 1, wherein the signal structure, the insulating structure, and the guard structure are disposed in the stack.

6. The electrical apparatus of claim 1, wherein the first portion of the outer contour of the guard structure is at least fifty percent of the outer contour of the guard structure.

7. The electrical apparatus of claim 1, wherein:
the thickness of the edges of the outer contour of the signal structure is substantially less than a length of the elongate portion of the first shape; and
the thickness of the edges of the outer contour of the guard structure is substantially less than a length of the elongate portion of the second shape.

8. The electrical apparatus of claim 1, wherein:
the thickness of the edges of the outer contour of the signal structure is greater than zero; and
the thickness of the edges of the outer contour of the guard structure is greater than zero.

9. The electrical apparatus of claim 1, wherein the guard structure is positioned to electrically guard only the signal structure.

10. An electrical apparatus comprising:
an electrically conductive signal structure;
an electrically conductive guard structure;
an electrically insulating structure disposed between the signal structure and the guard structure, wherein the signal structure is electrically insulated from the guard structure, wherein the signal structure, a portion of the insulating structure, and a portion of the guard structure have substantially a same size and shape and are aligned one with another in a stack; and
a substrate, wherein:
one of the signal structure or the guard structure comprises a trace disposed on a surface of the substrate,
the other of the signal structure or the guard structure comprises a first portion of a conductive plane embedded in the substrate, wherein a cut in the conductive plane separates the first portion of the conductive plane from a second portion of the conductive plane, and
the insulating structure comprises a first portion of a layer of the substrate disposed between the trace and the embedded conductive plane, wherein a cut in the layer of the substrate separates the first portion of the layer of the substrate from a second portion of the layer of the substrate.

11. The apparatus of claim 10, further comprising a trench extending from the surface of the substrate into the substrate, the trench comprising the cut in the layer of the substrate and the cut in the conductive plane.

12. The apparatus of claim 11, wherein the trench outlines at least a portion of the trace disposed on the surface of the substrate.

13. An electrical apparatus comprising:
an electrically conductive signal structure having an outer contour consisting solely of edges having a thickness in a substantially vertical direction, the outer contour of the signal structure defining a shape of the signal structure in a horizontal plane, the entire outer contour of the signal structure being electrically insulated from any conductive elements in a same horizontal plane as the signal structure;
an electrically conductive guard structure having an outer contour consisting solely of edges having a thickness in a substantially vertical direction, the outer contour of the guard structure defining a shape of the guard structure in a horizontal plane, the entire outer contour of the guard structure being electrically insulated from any conductive elements in a same horizontal plane as the guard structure;
an electrically insulating structure disposed between the signal structure and the guard structure, wherein the signal structure is electrically insulated from the guard structure;
a substrate, wherein the signal structure, the insulating structure, and the guard structure are disposed in layers of the substrate; and
a plurality of electrically conductive spring probes, wherein one of the probes is coupled to the signal structure, wherein the substrate is part of a probe card assembly and the probes are disposed to contact an electronic device to be tested and the probes are electrically connected to an interface to a tester for controlling testing of the electronic device, the one of the probes being electrically connected to the interface through the signal structure,
wherein:
the shape of the outer contour of the signal structure comprises a first end and a second end and an elongated portion between the first end and the second end,
the shape of a first portion of the outer contour of the guard structure comprises a first end and a second end and an elongated portion between the first end and the second end,
the shape of the outer contour of the signal structure and the shape of the first portion of the outer contour of the guard structure are substantially the same and are aligned one with another vertically in a stack.

14. An electrical apparatus comprising:
an electrically conductive signal structure;
an electrically conductive guard structure; and
an electrically insulating structure disposed between the signal structure and the guard structure, wherein the signal structure is electrically insulated from the guard structure,
wherein the signal structure and the guard structure are aligned one with another vertically in a stack,
the apparatus further comprising a substrate comprising a first conductive layer of conductive material embedded between insulating layers of the substrate, wherein:
one of the signal structure or the guard structure comprises a first portion of the first conductive layer, wherein a cut in the first conductive layer separates the first portion of the first conductive layer from a second portion of the first conductive layer, and
the insulating structure comprises a first portion of one of the insulating layers, wherein a cut in the one of the insulating layers separates the first portion of the one of the insulating layers from a second portion of the one of the insulating layers.

15. An electrical apparatus comprising:
an electrically conductive signal structure;
an electrically conductive guard structure;
an electrically insulating structure disposed between the signal structure and the guard structure, wherein the signal structure is electrically insulated from the guard structure, wherein the signal structure, a portion of the insulating structure, and a portion of the guard structure have substantially a same size and shape and are aligned one with another in a stack; and
a multi-layer substrate and a trench extending from a surface of the substrate into the substrate, wherein:
one of the signal structure or the guard structure comprises at least a portion of a first conductive layer of the multi-layer substrate;
the other of the signal structure or the guard structure comprises a first portion of a second conductive layer of the multi-layer substrate, the first portion separated from a second portion of the second conductive layer by the trench; and
the guard structure comprises a first portion of an insulating layer of the multi-layer substrate disposed between the first conductive layer and the second conductive layer, the first portion of the insulating layer separated from a second portion of the insulating layer by the trench.

16. An electrical apparatus further comprising
an electrically conductive signal structure having an outer contour consisting solely of edges having a thickness in a substantially vertical direction, the outer contour of the signal structure defining a shape of the signal structure in a horizontal plane, the entire outer contour of the signal structure being electrically insulated from any conductive elements in a same horizontal plane as the signal structure;
an electrically conductive guard structure having an outer contour consisting solely of edges having a thickness in a substantially vertical direction, the outer contour of the guard structure defining a shape of the guard structure in a horizontal plane, the entire outer contour of the guard structure being electrically insulated from any conductive elements in a same horizontal plane as the guard structure;
an electrically insulating structure disposed between the signal structure and the guard structure, wherein the signal structure is electrically insulated from the guard structure; and
a substrate comprising a plurality of horizontal layers, wherein: the signal structure is disposed in a first of the layers, the electrically insulating structure is disposed in a second of the layers, and the guard structure is disposed in a third of the layers,
wherein:
the shape of the outer contour of the signal structure comprises a first end and a second end and an elongated portion between the first end and the second end,
the shape of a first portion of the outer contour of the guard structure comprises a first end and a second end and an elongated portion between the first end and the second end,
the shape of the outer contour of the signal structure and the shape of the first portion of the outer contour of the guard structure are substantially the same and are aligned one with another vertically in a stack, and
the electrically insulating structure has an outer contour consisting solely of edges having a thickness in a substantially vertical direction, the outer contour of the insulating structure defining a shape of the insulating structure in a horizontal plane, and the shape of the outer contour of the insulating structure is substantially the same as the shape of the first portion of the outer contour of the guard structure and the shape of the outer contour of the signal structure.

17. An electrical apparatus comprising:
an electrically conductive signal structure;
an electrically conductive guard structure;
an electrically insulating structure disposed between the signal structure and the guard structure, wherein the signal structure is electrically insulated from the guard structure; and
a substrate comprising a plurality of horizontal layers, wherein: the signal structure is disposed in a first of the layers, the electrically insulating structure is disposed in a second of the layers, and the guard structure is disposed in a third of the layers,
wherein:
a shape of a horizontal outer contour of the signal structure comprises a first end and a second end and an elongated portion between the first end and the second end,
a shape of a horizontal outer contour of a portion of the guard structure comprises a first end and a second end and an elongated portion between the first end and the second end, the shape of the horizontal contour of the signal structure and the shape of the portion of the horizontal contour of the guard structure are substantially the same and are aligned one with another vertically in a stack,
the signal structure comprises a first portion of the first layer, and the horizontal outer contour of the signal structure comprises a cut in the first layer that separates the first portion of the first layer from a second portion of the first layer;
the electrically insulating structure comprises a first portion of the second layer, and the horizontal outer contour of the electrically insulating structure comprises a cut in the second layer that separates the first portion of the second layer from a second portion of the second layer; and
the guard structure comprises a first portion of the third layer, and the horizontal outer contour of the guard structure comprises a cut in the third layer that separates the first portion of the third layer from a second portion of the third layer.

18. The apparatus of claim 17, wherein:
the substrate is a ceramic substrate,
the first layer comprises an electrically conductive layer,
the third layer comprises an electrically conductive layer, and
the second layer comprises ceramic material disposed between the first layer and the second layer.

19. An electrical apparatus comprising:
an electrically conductive signal structure having an outer contour consisting solely of edges having a thickness in a substantially vertical direction, the outer contour of the signal structure defining a shape of the signal structure in a horizontal plane, the entire outer contour of the signal structure being electrically insulated from any conductive elements in a same horizontal plane as the signal structure;
an electrically conductive guard structure having an outer contour consisting solely of edges having a thickness in a substantially vertical direction, the outer contour of the guard structure defining a shape of the guard structure in a horizontal plane, the entire outer contour of the guard structure being electrically insulated from any conductive elements in a same horizontal plane as the guard structure;

an electrically insulating structure disposed between the signal structure and the guard structure, wherein the signal structure is electrically insulated from the guard structure; and a substrate and an electrically conductive spring probe coupled to the signal structure, wherein the signal structure, the insulating structure, and the guard structure are disposed in layers of the substrate, wherein:
the shape of the outer contour of the signal structure comprises a first end and a second end and an elongated portion between the first end and the second end,
the shape of a first portion of the outer contour of the guard structure comprises a first end and a second end and an elongated portion between the first end and the second end,
the shape of the outer contour of the signal structure and the shape of the first portion of the outer contour of the guard structure are substantially the same and are aligned one with another vertically in a stack.

20. The apparatus of claim 19, wherein the signal structure comprises an outer layer of the substrate.

* * * * *